United States Patent
Lee et al.

(10) Patent No.: US 11,822,794 B2
(45) Date of Patent: Nov. 21, 2023

(54) MEMORY SYSTEM AND OPERATION METHOD OF THE MEMORY SYSTEM

(71) Applicant: SK hynix Inc., Icheon (KR)

(72) Inventors: Kyu Min Lee, Icheon (KR); In Jong Jang, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/730,121

(22) Filed: Apr. 26, 2022

(65) Prior Publication Data

US 2023/0152981 A1 May 18, 2023

(30) Foreign Application Priority Data

Nov. 12, 2021 (KR) .......... 10-2021-0155883

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ..... G06F 3/0619; G06F 3/0653; G06F 3/0679
See application file for complete search history.

(56) References Cited

U.S. PATENT DOCUMENTS

| | | | | |
|---|---|---|---|---|
| 5,129,079 A | * | 7/1992 | Miyashita | G06F 9/268 712/211 |
| 6,122,762 A | * | 9/2000 | Kim | G11C 29/32 714/726 |
| 9,727,442 B2 | * | 8/2017 | Kawasaki | G05B 19/0426 |
| 2003/0126508 A1 | * | 7/2003 | Litt | G06F 11/25 714/39 |
| 2004/0213060 A1 | * | 10/2004 | Naso | G11C 29/16 365/201 |
| 2014/0075255 A1 | * | 3/2014 | Lee | G01R 31/31705 714/727 |

FOREIGN PATENT DOCUMENTS

KR 1020150102701 A 9/2015
KR 101806807 B1 12/2017

* cited by examiner

*Primary Examiner* — Hiep T Nguyen

(57) ABSTRACT

A memory system includes: a storage device for storing data; a system memory in which normal firmware and debugging firmware are stored; a firmware implementer for implementing the normal firmware or the debugging firmware; and a controller for controlling the storage device in a normal mode in which the memory system is driven by the normal firmware. When an error detected in the normal mode is uncorrectable, the controller uploads the debugging firmware stored in the system memory to the firmware implementer to change the normal mode to a debugging mode. The firmware implementer performs a debugging operation on the storage device by implementing the uploaded debugging firmware.

35 Claims, 17 Drawing Sheets

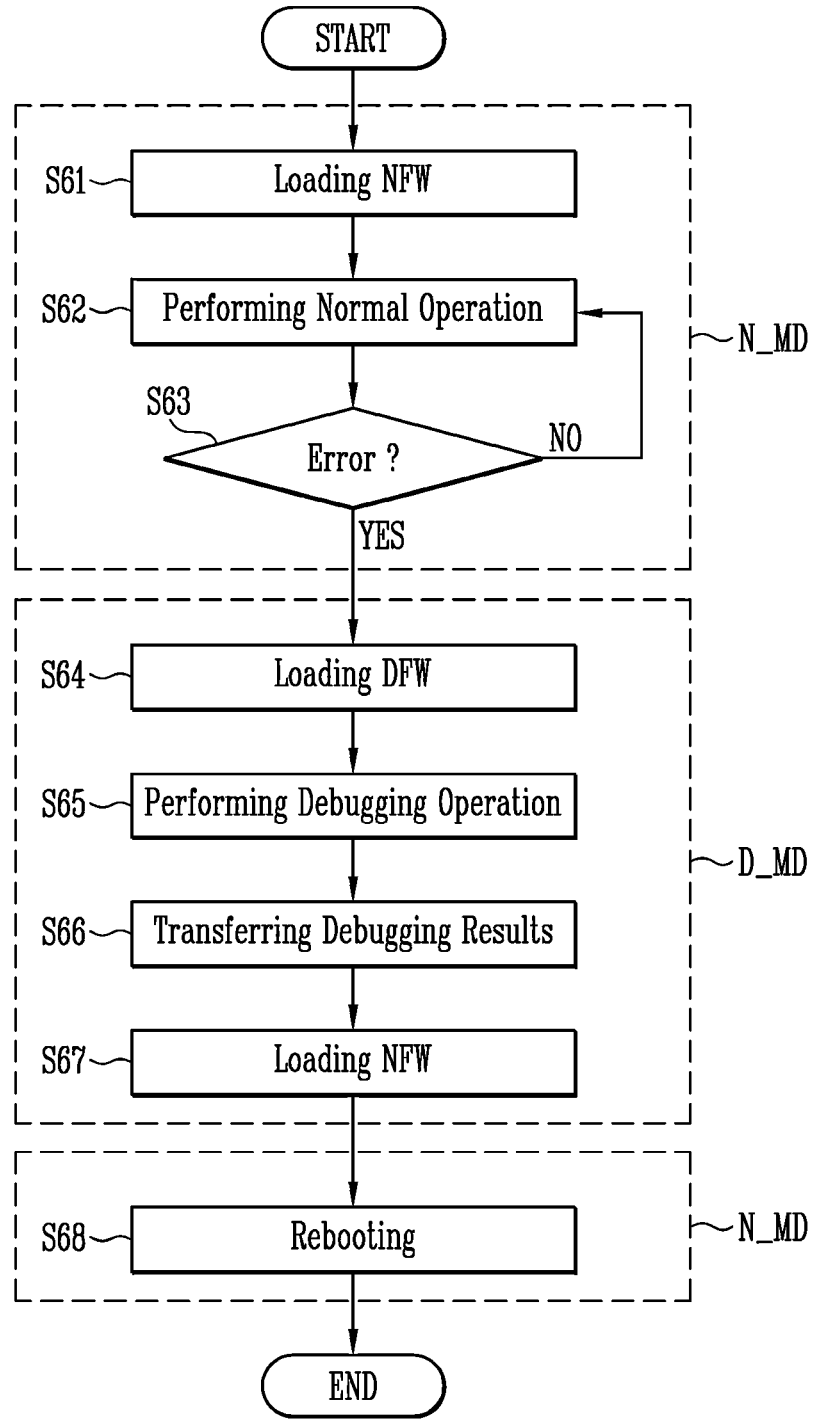

Rebooting
[N_MD]

MEMORY SYSTEM AND OPERATION METHOD OF THE MEMORY SYSTEM

CROSS-REFERENCE TO RELATED APPLICATION

The present application claims priority under 35 U.S.C. § 119(a) to Korean patent application number 10-2021-0155883 filed on Nov. 12, 2021, in the Korean Intellectual Property Office, the entire disclosure of which is incorporated by reference herein.

BACKGROUND

1. Technical Field

The present disclosure generally relates to a memory system and an operation method of the memory system, and more particularly, to a memory system capable of being driven by firmware and an operation method of the memory system.

2. Related Art

A memory system may include a storage device in which data is stored, a controller capable of controlling the storage device, and a system memory in which firmware is stored.

The firmware is software capable of controlling hardware. The firmware may be stored in a Read Only Memory (ROM). The firmware may have priority as compared with general software capable of being performed in the controller. Therefore, when the memory system is booted, the firmware may be implemented first of all.

SUMMARY

Embodiments provide a memory system capable of selectively implementing normal firmware and debugging firmware therein without connecting to any external device, and an operation method of the memory system.

In accordance with an aspect of the present disclosure, there is provided a memory system including: a storage device configured to store data; a system memory in which normal firmware and debugging firmware are stored; a firmware implementer configured to implement the normal firmware or the debugging firmware; and a controller configured to control the storage device in a normal mode in which the memory system is driven by the normal firmware, wherein, when an error detected in the normal mode is uncorrectable, the controller uploads the debugging firmware stored in the system memory to the firmware implementer to change the normal mode to a debugging mode, and wherein the firmware implementer performs a debugging operation on the storage device by implementing the uploaded debugging firmware.

In accordance with another aspect of the present disclosure, there is provided a method of operating a memory system, including a controller, a system memory, a firmware implementer, and a storage device, the method including: storing normal firmware and debugging firmware in the system memory; uploading the normal firmware stored in the system memory to the firmware implementer; setting up the controller in a normal mode according to the normal firmware uploaded to the firmware implementer; uploading the debugging firmware stored in the system memory to the firmware implementer to change the normal mode to a debugging mode, when an error occurs in the storage device driven in the normal mode; performing a debugging operation on the storage device according to the debugging firmware uploaded to the firmware implementer; and changing the debugging mode to the normal mode by uploading the normal firmware stored in the system memory to the firmware implementer, after the debugging operation is completed.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 6 is a flowchart illustrating an operation method of the memory system in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
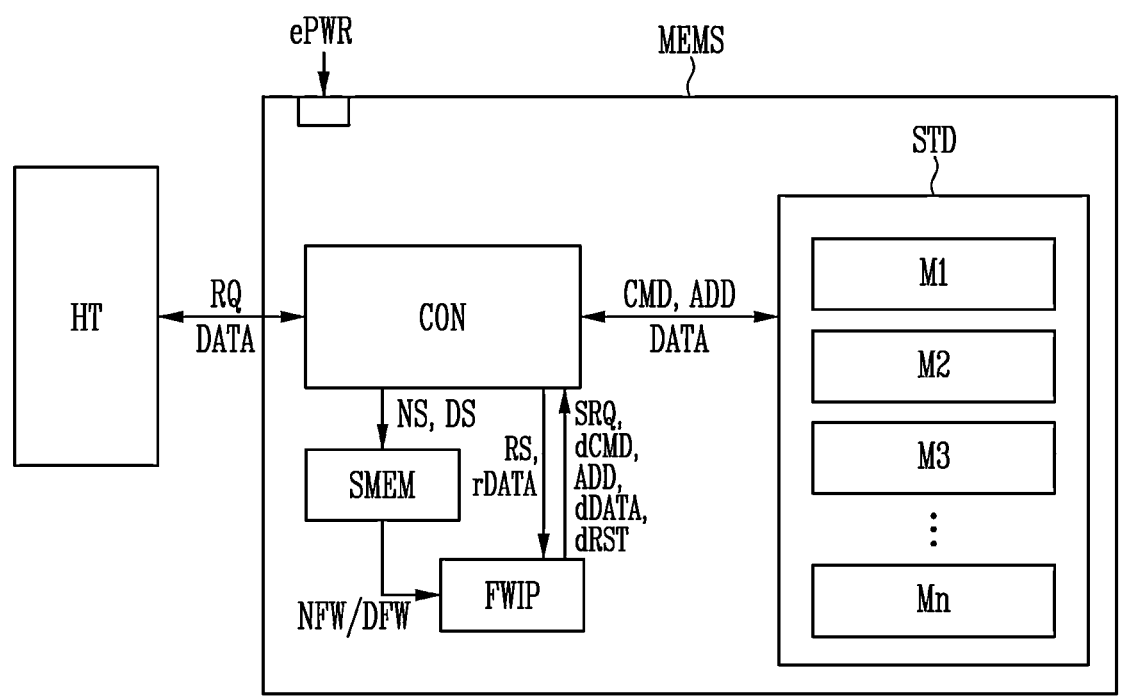
FIG. 1 illustrates a memory system in accordance with an embodiment of the present disclosure.

FIG. 1 illustrates a memory system MEMS in accordance with an embodiment of the present disclosure.

Referring to FIG. 1, the memory system MEMS may be configured to store, erase, or output data DATA in response to a request of a host HT. For example, the memory system MEMS may include a storage device STD, a controller CON, a system memory SMEM, and a firmware implementer FWIP.

The storage device STD may include first to nth memory devices M1 to Mn, n being a positive integer. Each of the first to nth memory devices M1 to Mn may be configured with a volatile memory device or a nonvolatile memory device. The volatile memory device is a memory device in which data is stored only when power is supplied, and data stored in the volatile memory device disappears when the supply of power is interrupted. The volatile memory device may be a Static Random Access Memory (SRAM) or a Dynamic Random Access Memory (DRAM). The nonvolatile memory device is a memory device in which stored data does not disappear even when the supply of power is interrupted, and may be a Read Only Memory (ROM), a Programmable ROM (PROM), an Electrically Programmable ROM (EPROM), an Electrically Erasable and Programmable ROM (EEPROM), a flash memory, or the like.

The memory system MEMS may be supplied with external power ePWR from the outside, and use internal power obtained by adjusting a level of the external power ePWR as power of the storage device STD, the controller CON, the system memory SMEM, and the firmware implementer FWIP. The external power ePWR may be supplied from the host HT or be supplied from a separate power supply.

When a request RQ output from the host HT is provided thereto, the controller CON may generate a command for controlling the storage device STD according to the request RQ. The controller CON may be configured to manage a logical address used in the host HT and a physical address used in the storage device STD, and convert the request RQ for performing one of various operations into a command CMD and then output the command CMD to the storage device STD. For example, in a program operation, the controller CON may map a logical address used in the host HT and a physical address used in the storage device STD to each other in order to store data in the storage device STD according to the physical address. In a read operation, the controller CON searches for a physical address mapped to a logical address from the host HT, reads data from the storage device STD according to the physical address, and outputs the read data to the host HT.

The system memory SMEM may store normal firmware NFW and debugging firmware DFW. The system memory SMEM may be configured as a nonvolatile memory device. For example, the system memory SMEM may be configured as a Read Only Memory (ROM), a Programmable ROM (PROM), an Electrically Programmable ROM (EPROM), an Electrically Erasable and Programmable ROM (EEPROM), a flash memory, or the like.

The firmware implementer FWIP may be configured to upload thereto one of the normal firmware NFW and the debugging firmware DFW, which are stored in the system memory SMEM, and implement or execute the uploaded firmware. For example, the firmware implementer FWIP may include a processor for storing and driving the normal firmware NFW or the debugging firmware DFW and a trimming circuit for inputting/outputting various signals under the control of the processor.

The normal firmware NFW may be implemented when the memory system MEMS normally operates, and the debugging firmware DFW may be implemented to perform a debugging erase operation of a memory block in which an uncorrectable error is detected in a normal mode. For example, the normal firmware NFW may be software for driving hardware included in the memory system MEMS, and the debugging firmware DFW may be software for detecting an error in the memory system MEMS and erasing data stored in a memory block in which the error is detected, thereby allowing the memory block to be reused in the normal mode.

For example, the normal firmware NFW may include a setup request SRQ for setting up various devices in the memory system MEMS. The debugging firmware DFW may include various debugging commands dCMD for performing a debugging operation such as debugging program, debugging read, or debugging erase, an address ADD for accessing the storage device STD, and debugging data dDATA for a debugging program operation. In addition, the debugging firmware DFW may include parameters for setting the storage device STD in the debugging operation and various information for directly controlling the storage device STD.

When the normal firmware NFW is uploaded to the firmware implementer FWIP, the firmware implementer FWIP may output the setup request SRQ to the controller CON by implementing the normal firmware NFW. When the debugging firmware DFW is uploaded to the firmware implementer FWIP, the firmware implementer FWIP may transmit a debugging command dCMD, an address ADD, and debugging data dDATA to the controller CON by implementing the debugging firmware DFW. In the debugging operation, the firmware implementer FWIP may receive data rDATA read from the storage device STD through the controller CON, and count the number of error bits included in the data rDATA. When the debugging operation is completed, the firmware implementer FWIP may output a debugging result dRST to the controller CON.

When a reset signal RS is received from the controller CON, the firmware implementer FWIP may delete the debugging firmware DFW uploaded thereto.

In a normal state in which any error is not detected in the memory system MEMS, the normal firmware NFW may be uploaded to the firmware implementer FWIP. When an uncorrectable error is detected in the memory system MEMS, the debugging firmware DFW may be uploaded to the firmware implementer FWIP.

For example, when an uncorrectable error is detected in the memory system MEMS, the debugging firmware DFW may be uploaded to the firmware implementer FWIP to replace the normal firmware NFW uploaded to the firmware implementer FWIP. The uncorrectable error represents an error that cannot be corrected by an error correction function of the normal mode. For example, when the number of error bits of the error detected in the storage device STD is greater than a normal reference number in the normal mode, the controller CON cannot correct the error.

The debugging firmware DFW uploaded to the firmware implementer FWIP may include various debugging commands dCMD, an address ADD, and debugging data dDATA, which are used to detect and correct such an error. The address ADD included in the debugging firmware DFW may be a physical address of the storage device STD such that the debugging firmware DFW can directly access the storage device STD using the address ADD.

When the debugging operation of detecting and correcting the error is completed, the debugging firmware DFW uploaded to the firmware implementer FWIP may be replaced with the normal firmware NFW. After that, when the memory system MEMS is rebooted, the normal firmware NFW stored in the firmware implementer FWIP may be implemented.

The system memory SMEM and the firmware implementer FWIP may operate under the control of the controller CON. For example, when an uncorrectable error occurs in data read from the storage device STD, the controller CON may output a debugging signal DS to the system memory SMEM. When the debugging operation is completed, the controller CON may output a normal signal NS to the system memory SMEM. The system memory SMEM may upload the debugging firmware DFW to the firmware implementer FWIP in response to the debugging signal DS, and upload the normal firmware NFW to the firmware implementer FWIP in response to the normal signal NS. Also, the controller CON may reset the firmware implementer FWIP by outputting the reset signal RS to the firmware implementer FWIP. When the firmware implementer FWIP is reset, previously uploaded firmware is deleted from the firmware implementer FWIP. Therefore, the firmware implementer FWIP may be in a state in which another firmware can be uploaded to the firmware implementer FWIP.

Figure 2:
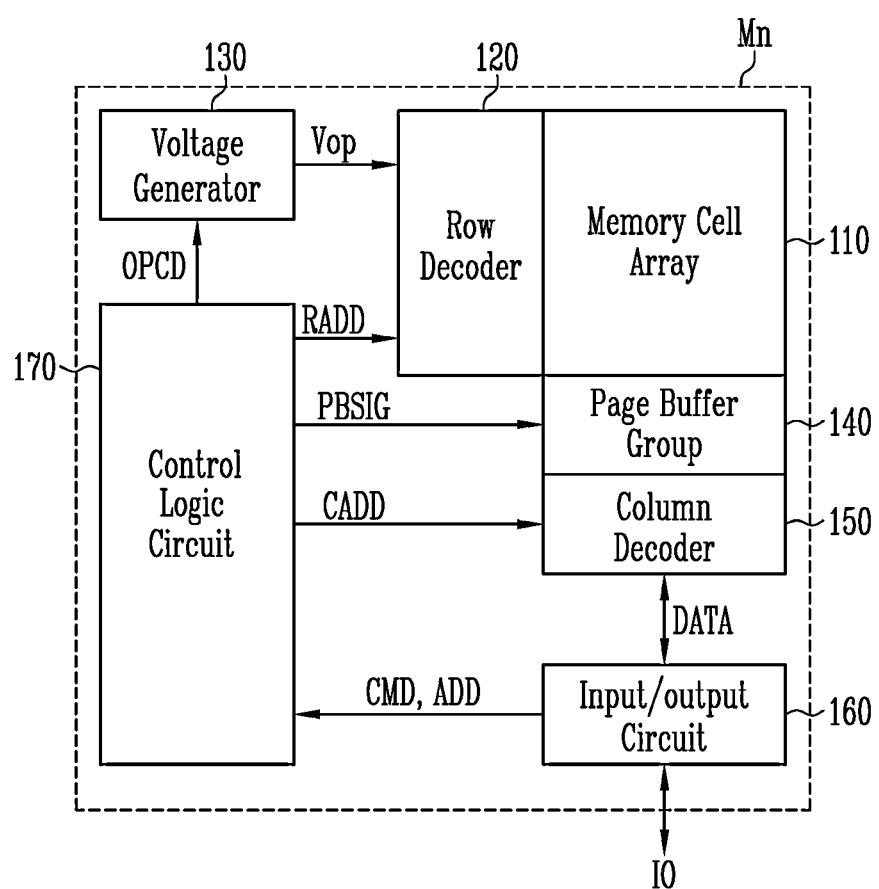
FIG. 2 illustrates a memory device.

FIG. 2 illustrates a memory device. The first to nth memory devices M1 to Mn included in the storage device STD shown in FIG. 1 are configured identically to one another. FIG. 2 illustrates the nth memory device Mn among the first to nth memory devices M1 to Mn as an example.

The nth memory device Mn may include a memory cell array 110 storing data and a peripheral circuit 120 to 170 capable of performing a program, read, or erase operation on the memory cell array 110.

The memory cell array 110 may include a plurality of memory blocks in which data is stored. Each of the memory blocks may include a plurality of memory cells, and the memory cells may be implemented in a two-dimensional structure in which the memory cells are arranged in a direction parallel to a top surface of a substrate or a three-dimensional structure in which the memory cells are stacked in a vertical direction above the substrate.

The peripheral circuit 120 to 170 may include a row decoder 120, a voltage generator 130, a page buffer group 140, a column decoder 150, an input/output circuit 160, and a control logic circuit 170.

The row decoder 120 may select one memory block among the memory blocks included in the memory cell array 110 according to a row address RADD, and transmit operating voltages Vop to the selected memory block.

The voltage generator 130 may generate and output the operating voltages Vop necessary for various operations in response to an operation code OPCD. For example, the voltage generator 130 may generate a program voltage, a read voltage, an erase voltage, a pass voltage, a verify voltage, a negative voltage, and the like in response to the operation code OPCD, and selectively output the generated voltages.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data in a program or read operation. The page buffers may sense voltages of the bit lines, which vary according to threshold voltages of the memory cells, in a read operation or a verify operation. That is, it may be determined whether the threshold voltages of the memory cells are lower or higher than the read voltage or the verify voltage, according to a result of the sensing operation performed by the page buffers.

The column decoder 150 may transmit data DATA between the input/output circuit 160 and the page buffer group 140 according to a column address CADD.

The input/output circuit 160 may be connected to the controller CON shown in FIG. 1 through input/output lines IO. The input/output circuit 160 may receive or output a command CMD, an address ADD, and/or data DATA through the input/output lines IO. For example, the input/output circuit 160 may transmit a command CMD and an address ADD, which are received through the input/output lines IO from the controller CON shown in FIG. 1, to the control logic circuit 170, and transmit data DATA received from the controller CON through the input/output lines IO to the column decoder 150. The input/output circuit 160 may output data DATA received from the column decoder 150 to the controller CON through the input/output lines IO.

The control logic circuit 170 output the operation code OPCD, the row address RADD, the page buffer control signals PBSIG, and the column address CADD in response to the command CMD and the address ADD. For example, the control logic circuit 170 may include software for performing an algorithm in response to the command CMD and hardware for outputting various signals according to the address ADD and the algorithm.

Figure 3:
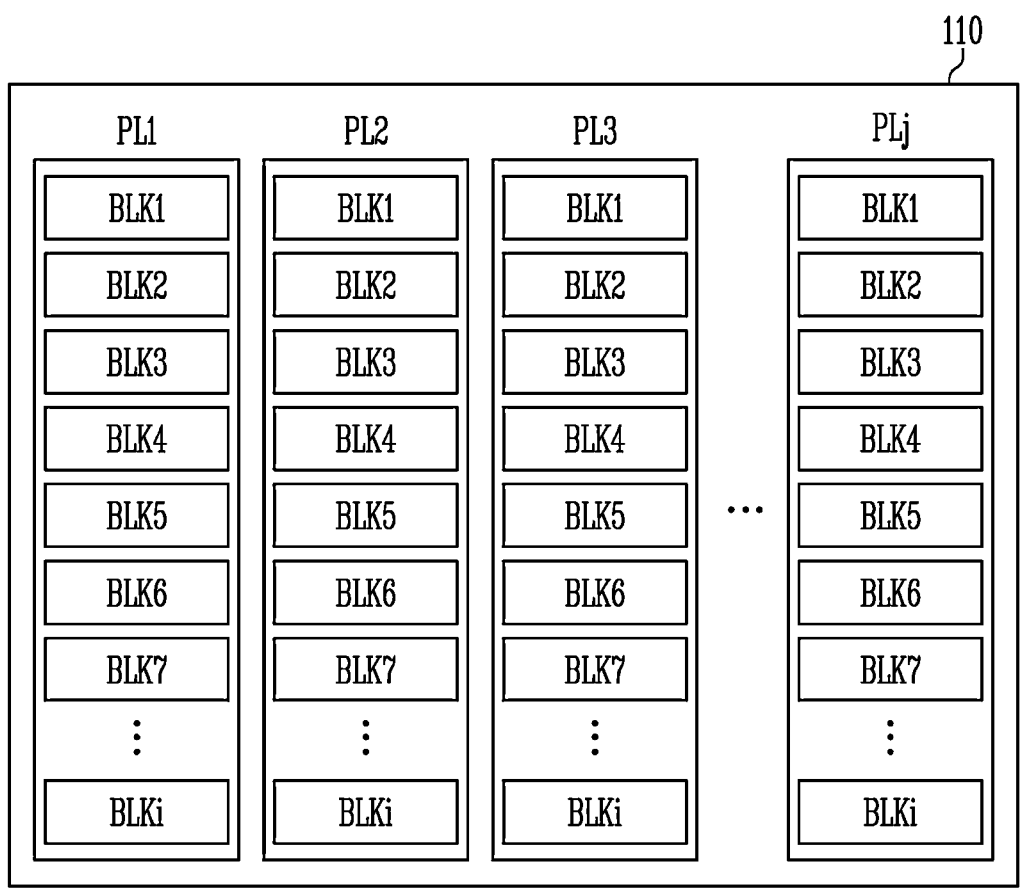
FIG. 3 illustrates a memory cell array.

FIG. 3 illustrates a memory cell array. The memory cell array illustrated in FIG. 3 may correspond to the memory cell array 110 shown in FIG. 2.

Referring to FIG. 3, the memory cell array 110 may be configured with a single plane or a multi-plane. The single plane means a configuration in which only one plane is included in the memory cell array 110, and the multi-plane means a configuration in which a plurality of planes are included in the memory cell array 110. In FIG. 3, the memory cell array 110 configured with the multi-plane is illustrated. Planes PL1 to PLj (j is a positive integer) may be defined as a memory area in which different row decoders and different page buffer groups are connected to the planes PL1 to PLj. For example, when the first to jth planes PL1 to PLj are included in the memory cell array 110, each of the first to jth planes PL1 to PLj may include first to ith memory blocks BLK1 to BLKi (i is a positive integer). First to ith memory blocks BLK1 to BLKi included in different planes may be connected to different row decoders and different page buffer groups, and first to ith memory blocks BLK1 to BLKi included in the same plane may be connected to the same row decoder and the same page buffer group. For example, the first memory block included in the first plane PL1 and the first memory block included jth plane PLj may be respectively connected to different row decoders and difference page buffer groups. The first to ith memory blocks BLK1 to BLKi included in the first plane PL1 may be connected to the same row decoder and the same page buffer group. The first to ith memory blocks BLK1 to BLKi each may have the same structure.

Figure 4:
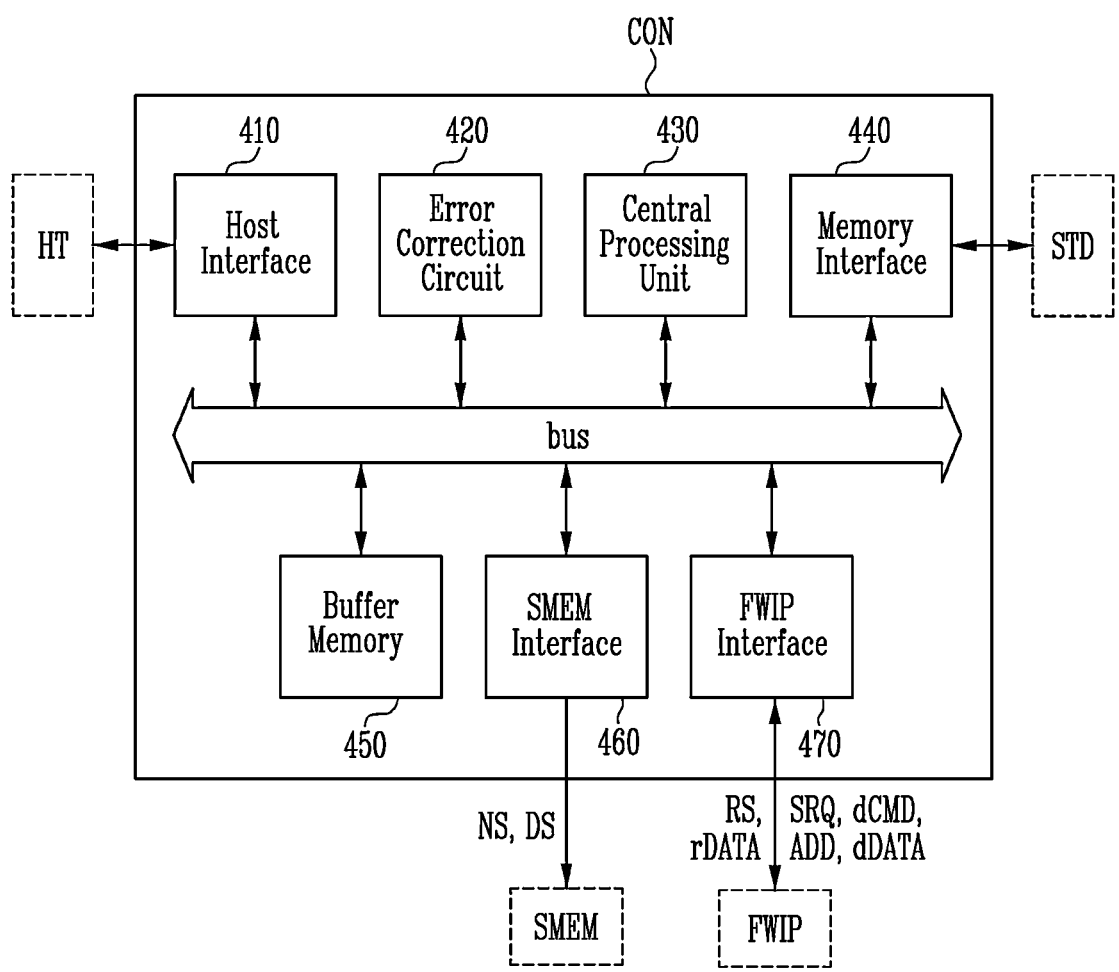
FIG. 4 illustrates a controller in accordance with an embodiment of the present disclosure.

FIG. 4 illustrates a controller in accordance with an embodiment of the present disclosure. The controller illustrated in FIG. 4 may correspond to the controller CON shown in FIG. 1.

Referring to FIG. 4, the controller CON may include a host interface 410, an error correction circuit 420, a central processing unit 430, a memory interface 440, a buffer memory 450, a system memory (SMEM) interface 460, and a firmware implementer (FWIP) interface 470. The host interface 410, the error correction circuit 420, the central processing unit 430, the memory interface 440, the buffer memory 450, the SMEM interface 460, and the FWIP interface 470 may communicate with each other through a bus.

The host interface 410 may transmit information and/or data between the host HT and the controller CON. For example, the host interface 410 may receive a request from the host HT and then transmit the received request to the central processing unit 430, and receive a logical address and data from the host HT. Also, the host interface 410 may output data read from the storage device STD to the host HT.

In a program operation, the error correction circuit 420 may perform an error correction encoding operation on data received from the host interface 410. In a read operation, the error correction circuit 420 may perform an error correction decoding operation on data received from the storage device STD through the memory interface 440. The error correction circuit 420 may correct a detected error when the number of error bits of the detected error is smaller than a normal reference number, and determine that the detected error is uncorrectable when the number of error bits is equal to or greater than the normal reference number.

The central processing unit 430 may control overall devices included in the controller CON. Also, the central processing unit 430 may convert various requests of the host HT into commands, and control the storage device STD by transmitting the commands to the storage device STD. For example, when the host HT transmits a program request, the central processing unit 430 may convert the program request into a program command, and transmit the program command to the storage device STD. When the host HT transmits a read request, the central processing unit 430 may convert the read request into a read command, and transmit the read command to the storage device STD.

When any uncorrectable error is not detected in the memory system MEMS, the central processing unit 430 may set up various values for operating the memory system MEMS in response to a setup request SRQ received from the FWIP interface 470 in booting. When the error correction circuit 420 determines that an uncorrectable error is detected in the memory system MEMS, the central processing unit 430 may output a reset signal RS and a debugging signal DS.

The memory interface 440 may transmit information between the controller CON and the storage device STD. For example, the memory interface 440 may transmit a command, an address, and/or data between the storage device STD and the controller CON.

The buffer memory 450 may temporarily store system data used in the controller CON. For example, the buffer memory 450 may store a mapping table between a logical address and a physical address, and temporarily store data received through the bus in a program or read operation. The buffer memory 450 may be configured as a volatile memory device or a nonvolatile memory device. The buffer memory 450 shown in FIG. 4 is disposed inside the controller CON. However, in some embodiments, the buffer memory 450 may be disposed outside the controller CON.

The SMEM interface 460 may transmit signals between the system memory SMEM and the controller CON. For example, a normal signal NS or the debugging signal DS, which are output from the central processing unit 430, may be transmitted to the SMEM interface 460, and the SMEM interface 460 may transfer the normal signal NS or the debugging signal DS to the system memory SMEM.

The FWIP interface 470 may transmit signals between the firmware implementer FWIP and the controller CON. For example, the FWIP interface 470 may transmit the reset signal RS output from the central processing unit 430 to the firmware implementer FWIP, receive a debugging command dCMD or debugging data dDATA, which is output from the firmware implementer FWIP, and then transmit the debugging command dCMD or the debugging data dDATA to the memory interface 440. When the debugging command dCMD is transmitted to the memory interface 440, debugging firmware may transmit an address ADD to the memory interface 440 through the FWIP interface 470. The address ADD transmitted by the debugging firmware is a physical address to be used in the storage device STD. In addition to the debugging command dCMD, the debugging data dDATA, and the address ADD, parameters may also be provided to the storage device STD such that a debugging operation is performed in the storage device STD. The parameters may include various setting values of operations to be performed in the debugging operation. For example, the parameters may include information on levels of voltages used in a debugging program, debugging read, or debugging erase operation, information on times at which the voltages are applied to a memory block, and the like.

In addition, in the debugging operation, the firmware implementer FWIP may receive data rDATA read from the storage device STD through the FWIP interface 470.

Figure 5:
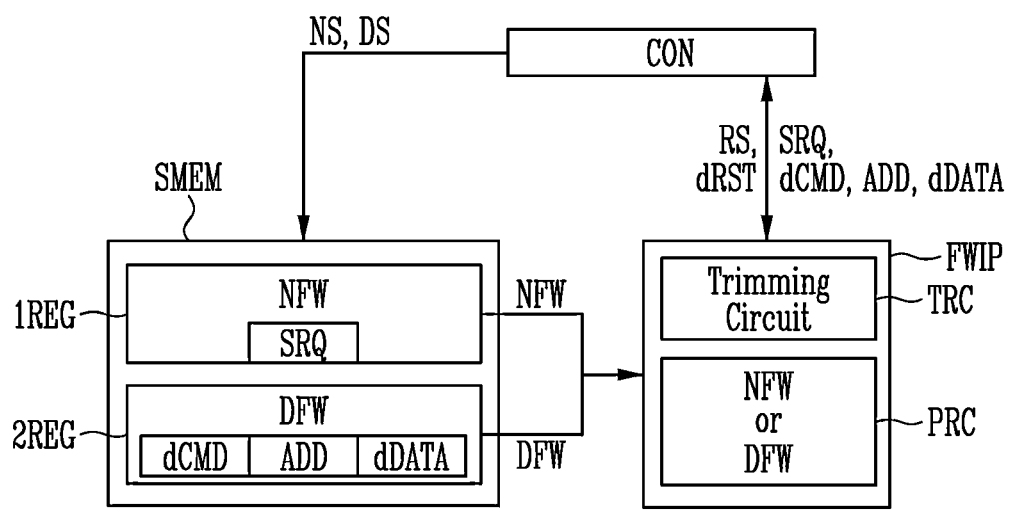
FIG. 5 illustrates a system memory and a firmware implementer in accordance with an embodiment of the present disclosure.

FIG. 5 illustrates a system memory and a firmware implementer in accordance with an embodiment of the present disclosure. The system memory and the firmware implementer illustrated in FIG. 5 may correspond to the system memory SMEM and the firmware implementer FWIP shown in FIG. 1, respectively.

Referring to FIG. 5, the system memory SMEM may include first and second storages 1REG and 2REG configured to store data. The first and the second storages 1REG and 2REG may be configured with a nonvolatile memory device. For example, the first and the second storages 1REG and 2REG may be configured with a Read Only Memory (ROM), a Programmable ROM (PROM), an Electrically Programmable ROM (EPROM), an Electrically Erasable and Programmable ROM (EEPROM), a flash memory, or the like.

Normal firmware NFW may be stored in the first storage 1REG, and debugging firmware DFW may be stored in the second storage 2REG. The normal firmware NFW may include the setup request SRQ for setting inputting/outputting of hardware included in the memory system MEMS. The debugging firmware DFW may include the debugging command dCMD, the address ADD and the debugging data dDATA so as to detect an error of the memory system MEMS and initialize a memory block in which the error is detected.

The system memory SMEM may output the normal firmware NFW or the debugging firmware DFW in response to the normal signal NS or the debugging signal DS, respectively, which is output from the controller CON. When the normal signal NS is received, the system memory SMEM may output the normal firmware NFW to the firmware implementer FWIP in response to the normal signal NS. When the debugging signal DS is received, the system memory SMEM may output the debugging firmware DFW to the firmware implementer FWIP in response to the debugging signal DS.

The firmware implementer FWIP may upload thereto the normal firmware NFW or the debugging firmware DFW, which is output from the system memory SMEM, and implement the uploaded normal firmware NFW or the uploaded debugging firmware DFW.

For example, the firmware implementer FWIP may include a processor PRC and a trimming circuit TRC. The processor PRC may upload thereto the normal firmware NFW or the debugging firmware DFW, and implement the uploaded firmware. The processor PRC may include software such as firmware and a logical circuit for implementing the firmware. The trimming circuit TRC may output various signals according to the firmware uploaded to the processor PRC. For example, the trimming circuit TRC may selectively output the setup request SRQ, the debugging command dCMD, and the debugging data dDATA according to the firmware uploaded to the processor PRC. For example, when the normal firmware NFW is uploaded to the processor PRC, the trimming circuit TRC may output the setup request SRQ according to the normal firmware NFW. For example, when the debugging firmware DFW is uploaded to the processor PRC, the trimming circuit TRC may output the debugging command dCMD according to the debugging firmware DFW. The trimming circuit TRC may output the debugging data dDATA according to a type of a debugging operation.

In addition, when the reset signal RS output from the controller CON is received, the processor PRC may delete the firmware uploaded thereto.

FIG. 6 is a flowchart illustrating an operation method of the memory system MEMS in accordance with an embodiment of the present disclosure. The operation method illustrated in FIG. 6 will be described with reference to FIG. 5.

Referring to FIGS. 5 and 6, the memory system MEMS may be driven in a normal mode N_MD in which the memory system MEMS is operated by the normal firmware NFW in a normal state, and be driven in a debugging mode T_MD in which the memory system MEMS is operated by the debugging firmware DFW in a state in which an error is detected. After the error is processed in the debugging mode T_MD, the memory system MEMS may be back to the normal mode N_MD.

Each of the normal mode N_MD and the debugging mode T_MD will be described in detail.

In the normal mode N_MD, the normal firmware NFW may be uploaded to the firmware implementer FWIP at S61. When the firmware implementer FWIP implements the normal firmware NFW, the memory system MEMS may perform various normal operations in the normal mode N_MD at S62. For example, the normal operations may include a normal program operation, a normal read operation, a normal erase operation, and the like, each of which is performed according to a request of the host HT.

An error detection operation for detecting an error in the memory system MEMS may be performed during a normal operation at S63. For example, in the normal operation, an operation performed in a selected memory block of the storage device STD may not be ended, a correctable error may repeatedly occur, or an operation for detecting various errors may be performed. When any error is not detected during the error detection operation (NO), the memory system MEMS may maintain the normal mode N_MD. On the other hand, when an error is detected in the error detection operation (YES), the memory system MEMS may be changed to the debugging mode T_MD.

When the error is detected at S63, the normal mode N_MD is changed to the debugging mode T_MD, and thus the debugging firmware DFW may be uploaded to the firmware implementer FWIP at S64.

In the conventional system, a separate external device is connected to a memory system to load debugging firmware DFW. However, in this embodiment, firmware may be autonomously changed in the memory system MEMS without being connected to any external device. For example, in the conventional system, an external device such as TRACE32® debugger is connected to the memory system, and the debugging firmware DFW is implemented through the connected external device. However, in this embodiment, the debugging firmware DFW may be stored inside the memory system MEMS, and the debugging firmware DFW may be autonomously implemented in the memory system MEMS when an error occurs.

Subsequently, a debugging operation may be performed by the debugging firmware DFW at S65. The debugging operation may include various operations according to the debugging firmware DFW. For example, the debugging operation may include a debugging program operation, a debugging read operation, a debugging erase operation, and the like. The debugging firmware DFW in accordance with this embodiment may include a debugging command dCMD for directly performing the debugging operation, and transmit, to the storage device STD, an address ADD for directly accessing the storage device STD. Therefore, addresses of all memory devices and all pages, which are included in the storage device STD, may be included in the debugging firmware DFW. Also, the debugging firmware DFW in accordance with this embodiment may include a debugging parameter and debugging data dDATA, which are to be used for the debugging operation. The debugging parameter may include various setting values of debugging operations to be performed in the storage device STD, and the debugging data dDATA may be used in the debugging program operation. The debugging firmware DFW may detect an error based on data read from the storage device STD in the debugging operation, and erase data stored in a memory block in which the error is detected.

After the debugging operation is performed at S65, the debugging firmware DFW may transfer debugging results obtained by performing the debugging operation to the controller CON at S66. For example, the debugging firmware DFW may transmit, to the controller CON, an address of the memory block on which the debugging erase operation is performed since the error is detected in the memory block. Alternatively, when the detected error is uncorrectable, the debugging firmware DFW may store the address of the memory block in which the uncorrectable error is detected, and transmit the stored address to the controller CON.

After the debugging results are transferred to the controller CON at S66, the normal firmware NFW may be uploaded to the firmware implementer FWIP at S67, and the debugging mode T_MD may be ended.

When the debugging mode T_MD is ended, the memory system MEMS may be changed again to the normal mode N_MD, and the memory system MEMS may be rebooted at S68. When the memory system MEMS is rebooted, the devices included in the memory system MEMS may be reset according to the normal firmware NFW uploaded to the firmware implementer FWIP.

The above-described operation method of the memory system MEMS will be described in detail by using the devices included in the memory system MEMS in accordance with this embodiment.

FIGS. 7A to 7I illustrate in detail the operation method of the memory system MEMS in accordance with an embodiment of the present disclosure.

Figure 7A:
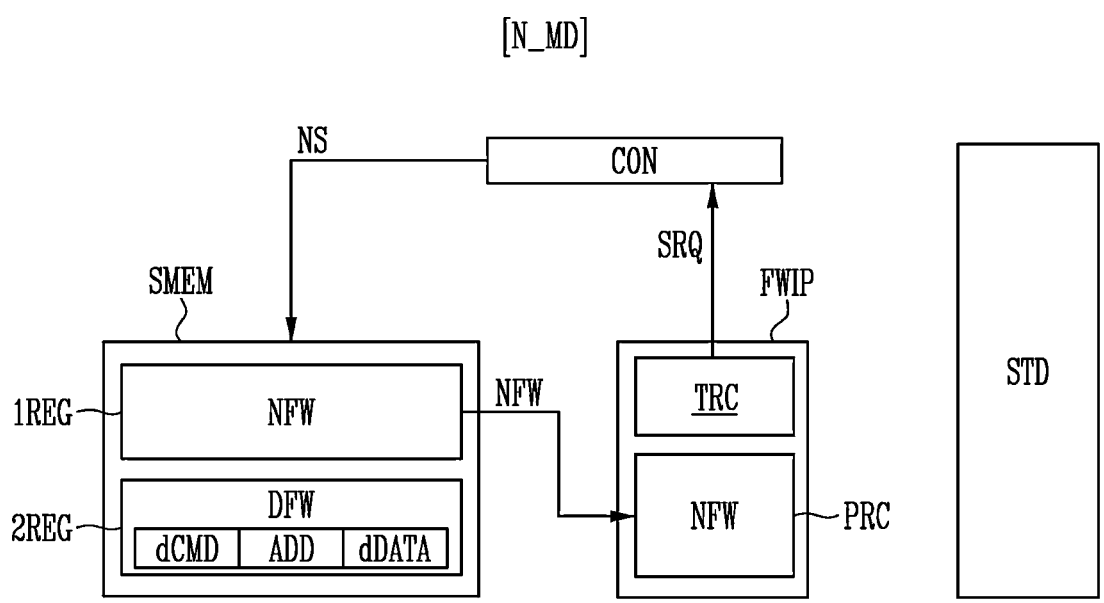
FIGS. 7A to 7I illustrate an operation method of a memory system in accordance with an embodiment of the present disclosure.

Referring to FIG. 7A, when the memory system MEMS is booted, the controller CON may generate a normal signal NS and transmit the normal signal NS to the system memory SMEM. The system memory SMEM may include the first storage 1REG in which the normal firmware NFW is stored and the second storage 2REG in which the debugging firmware DFW is stored. When the normal signal NS is received, the system memory SMEM may upload the normal firmware NFW stored in the first storage 1REG to the processor PRC of the firmware implementer FWIP.

After that, the processor PRC may output a setup request SRQ by using the trimming circuit TRC according to the normal firmware NFW. The setup request SRQ may be a request for setting up various devices included in the memory system MEMS. The controller CON may set up the devices included in the controller CON to be driven according to the setup request SRQ, and set up values for inputting/ outputting data to/from the storage device STD according to the setup request SRQ.

Figure 7B:
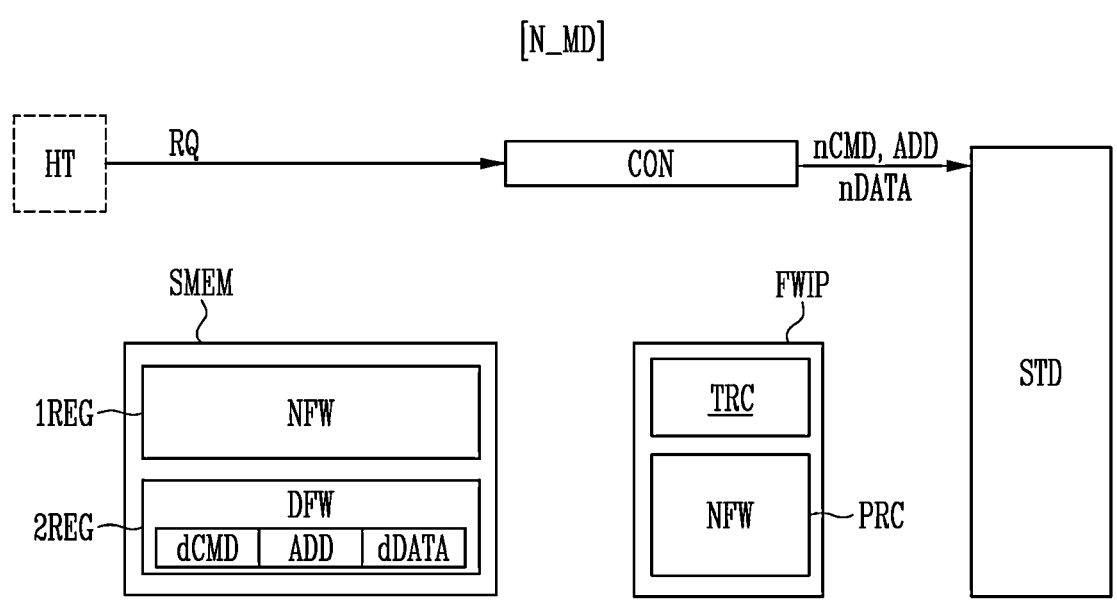

Referring to FIG. 7B, the controller CON may generate a normal command nCMD according to a request RQ of the host HT, and transmit the normal command nCMD and an address ADD to the storage device STD. when a normal program operation is performed, the controller CON may transmit the normal command nCMD, the address ADD, and normal data nDATA to the storage device STD.

Figure 7C:
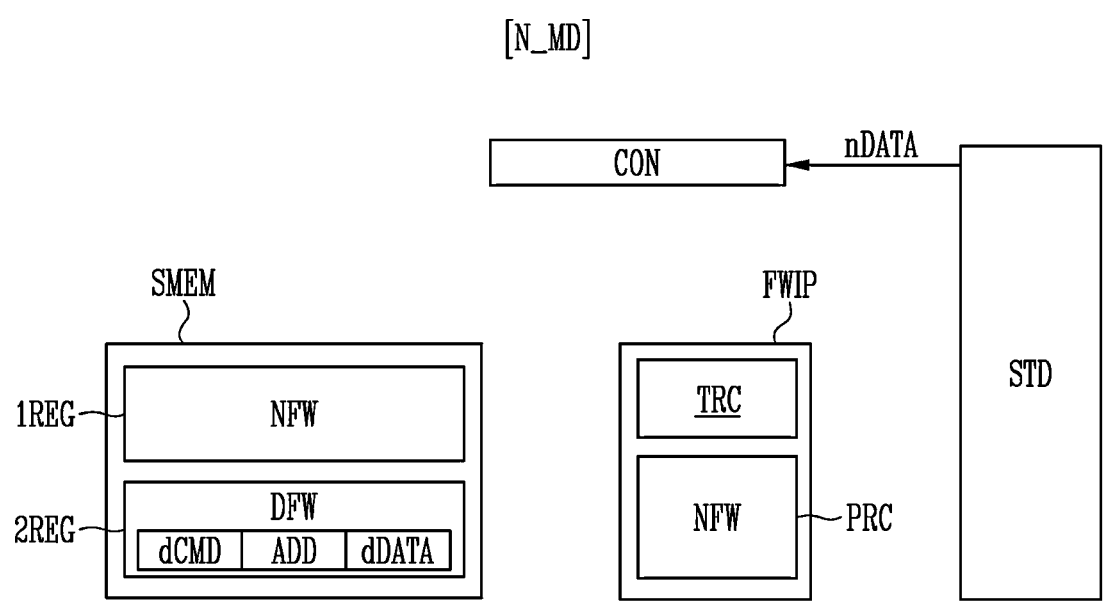

Referring to FIG. 7C, when a normal read operation is performed, the controller CON may receive normal data nDATA read from the storage device STD, and detect and correct an error in the received normal data n DATA.

Figure 7D:
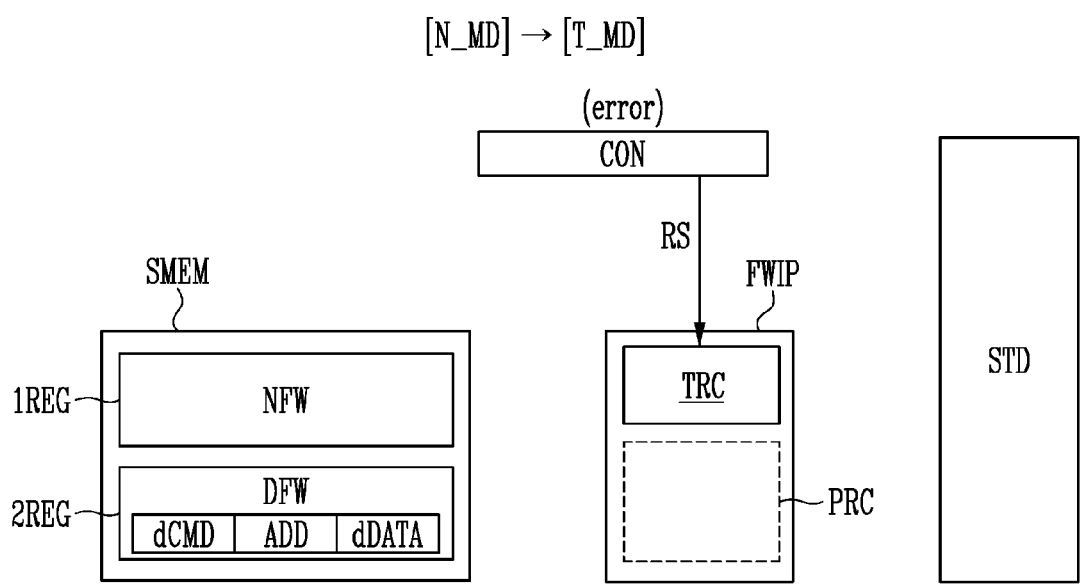

Referring to FIG. 7D, when the detected error is uncorrectable, the controller CON may output a reset signal RS to the trimming circuit TRC of the firmware implementer FWIP to change the mode of the memory system MEMS from the normal mode N_MD to the debugging mode T_MD. For example, when the number of error bits of the detected error exceeds a normal reference number having a preset value, the controller CON may determine that the error is uncorrectable, and output the reset signal RS to the trimming circuit TRC.

Figure 7E:
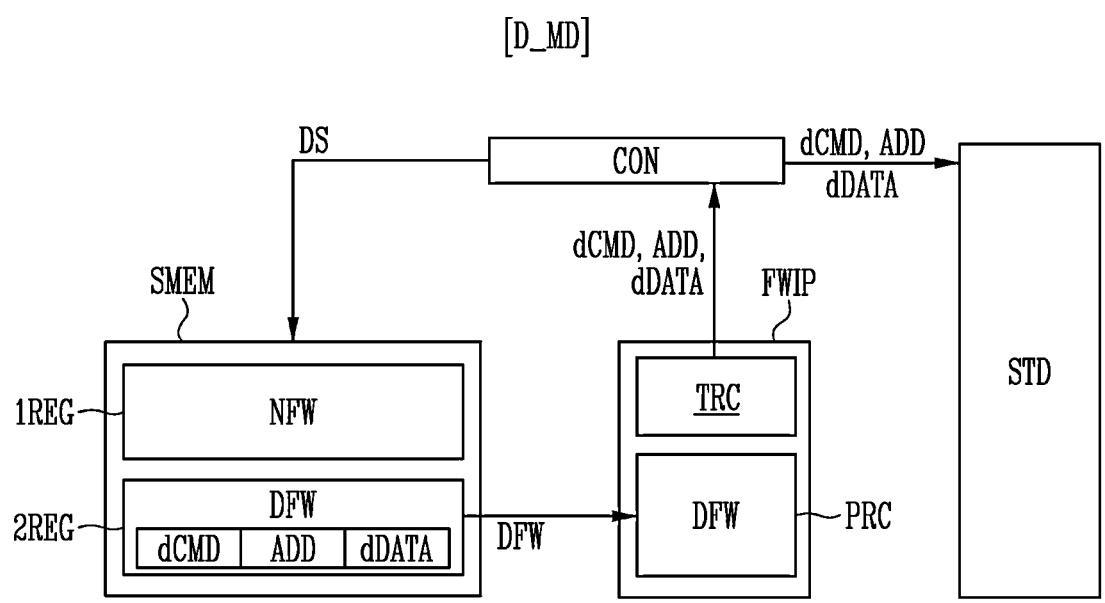

The trimming circuit TRC may delete the normal firmware NFW uploaded to the processor PRC in response to the reset signal RS. Referring to FIG. 7E, the controller CON may generate a debugging signal DS and transmit the debugging signal DS to the system memory SMEM. When the debugging signal DS is received, the system memory SMEM may upload the debugging firmware DFW stored in the second storage 2REG to the processor PRC of the firmware implementer FWIP.

The processor PRC may output a debugging command dCMD, an address ADD, and debugging data dDATA to the controller CON by using the trimming circuit TRC according to the debugging firmware DFW uploaded thereto. The debugging command dCMD may be a command for performing a debugging operation, and may be transmitted to the storage device STD without any intervention of the controller CON. That is, the debugging command dCMD is a command to be transmitted from the controller CON to the storage device STD even though there is no request from the host HT. For example, the debugging command dCMD may be a debugging program command, a debugging read command, or a debugging erase command.

A debugging program operation may be performed in the storage device STD according to the debugging program command. For example, the debugging firmware DFW may include the debugging data dDATA for performing the debugging program operation. The debugging data dDATA may have a pattern in which data 0 and data 1 are randomly mixed, or have a pattern configured with only one (0 or 1) of the data 0 and the data 1.

When an operation time for which the debugging data dDATA is programmed in a selected memory block is longer than a debugging reference time during the debugging program operation or when the number of pulses of a program voltage used to program the debugging data dDATA in the selected memory block is equal to or greater than a debugging reference pulse number during the debugging program operation, the debugging firmware DFW may store an address of the selected memory block to process the selected memory block as a bad block. The debugging reference time and the debugging reference pulse number, which are used in the debugging program operation, may be set to be greater than a normal reference time and a normal reference pulse number, respectively, which are used in an error correction operation of the normal mode N_MD.

When a debugging read operation is performed, the debugging firmware DFW may determine whether the debugging data dDATA programmed in the debugging program operation has been read without any error. When the number of error bits of an error included in the read debugging data dDATA is smaller than a debugging reference number, the debugging firmware DFW may perform a debugging erase operation for erasing data stored in a selected memory block in which the error occurs. When the number of error bits is equal to or greater than the debugging reference number in the debugging read operation, the debugging firmware DFW may process, as a bad block, the selected memory block in which the error is detected. That is, the selected memory block is set to be a bad block.

When the debugging erase operation is performed, the debugging firmware DFW may perform an erase operation on the selected memory block on which the debugging program operation has been performed, and it may be determined whether any error occurs in the selected memory block or not according to a time taken to erase all data stored in memory cells included in the selected memory block or a pulse number of an erase voltage used to erase all data stored in the memory cells included in the selected memory block.

For example, when the time taken to complete the erase operation for the selected memory block is longer than the debugging reference time, or when the pulse number of the erase voltage used for the erase operation is greater than the debugging reference pulse number, the debugging firmware DFW may store an address of the selected memory block to set the selected memory block as a bad block.

Figure 7F:
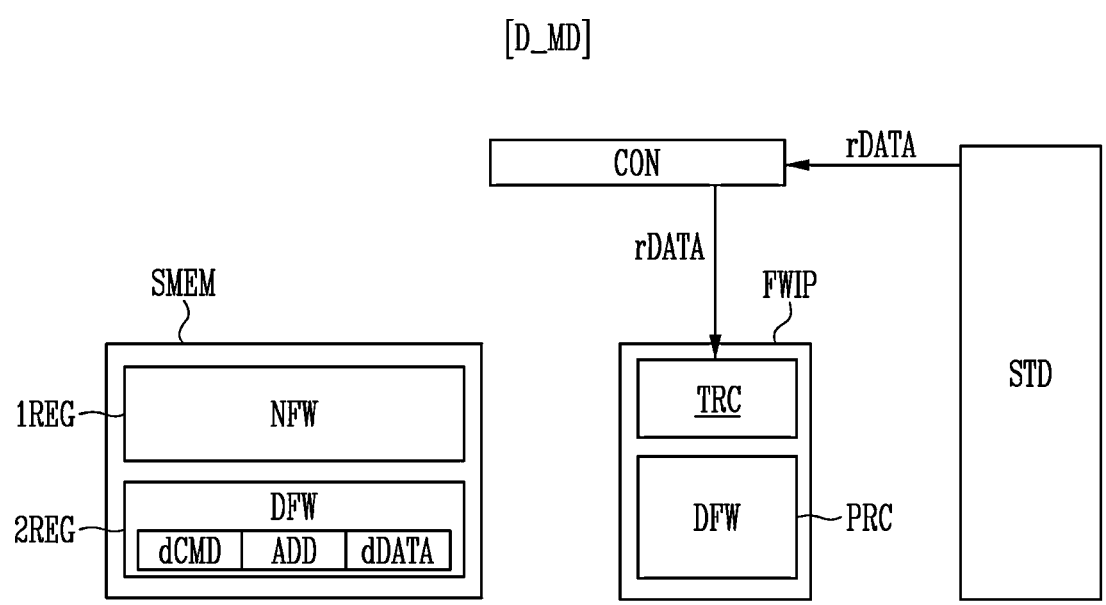

Referring to FIG. 7F, when the debugging read operation is performed, data rDATA read from the storage device STD may be transmitted to the processor PRC through the controller CON. When the data rDATA read from the storage device STD is received, the processor PRC may detect an error included in the read data rDATA, and count the number of error bits of the detected error in the read data rDATA.

Figure 7G:
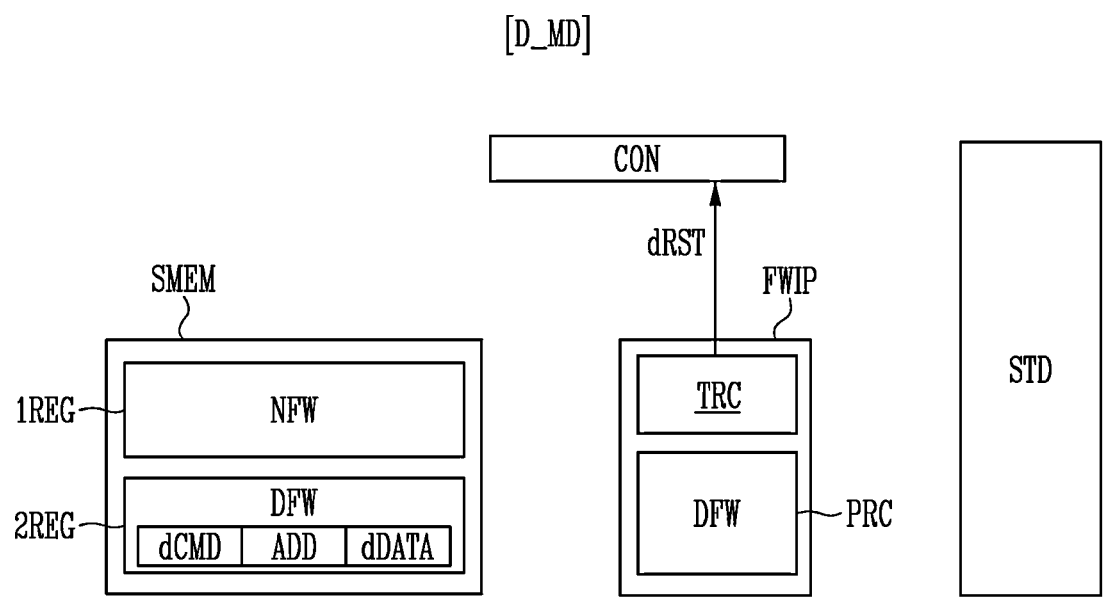

Referring to FIG. 7G, when it is determined that the detected error is correctable or uncorrectable, the processor PRC may transmit a debugging result dRST of the debugging operation to the controller CON. For example, when the detected error is correctable, the processor PRC may include, in the debugging result dRST, information such as an address of a selected memory block in which the correctable error is detected. When the detected error is uncorrectable, the processor PRC may include, in the debugging result dRST, an address of a selected memory block in which the uncorrectable error is detected and bad block information. The bad block information may indicate that the selected memory block is set to a bad block.

Figure 7H:
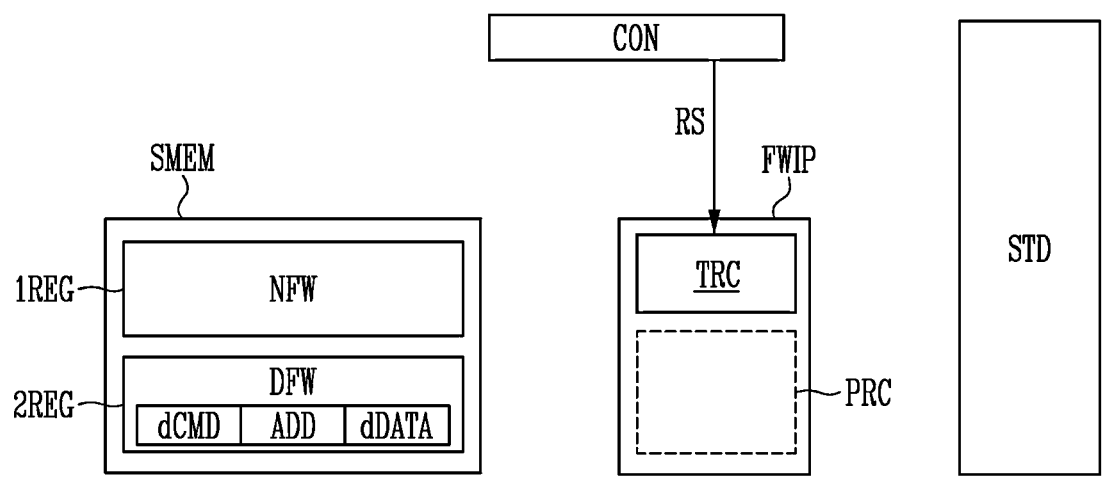

Referring to FIG. 7H, the controller CON may change the mode of the memory system MEMS from the debugging mode D_MD to the normal mode N_MD upon receiving the debugging result dRST. In order to change the mode of the memory system MEMS from the debugging mode D_MD to the normal mode N_MD, the controller CON may output a reset signal RS to the trimming circuit TRC of the firmware implementer FWIP. The trimming circuit TRC may delete the debugging firmware DFW uploaded to the processor PRC in response to the reset signal RS.

Figure 7I:
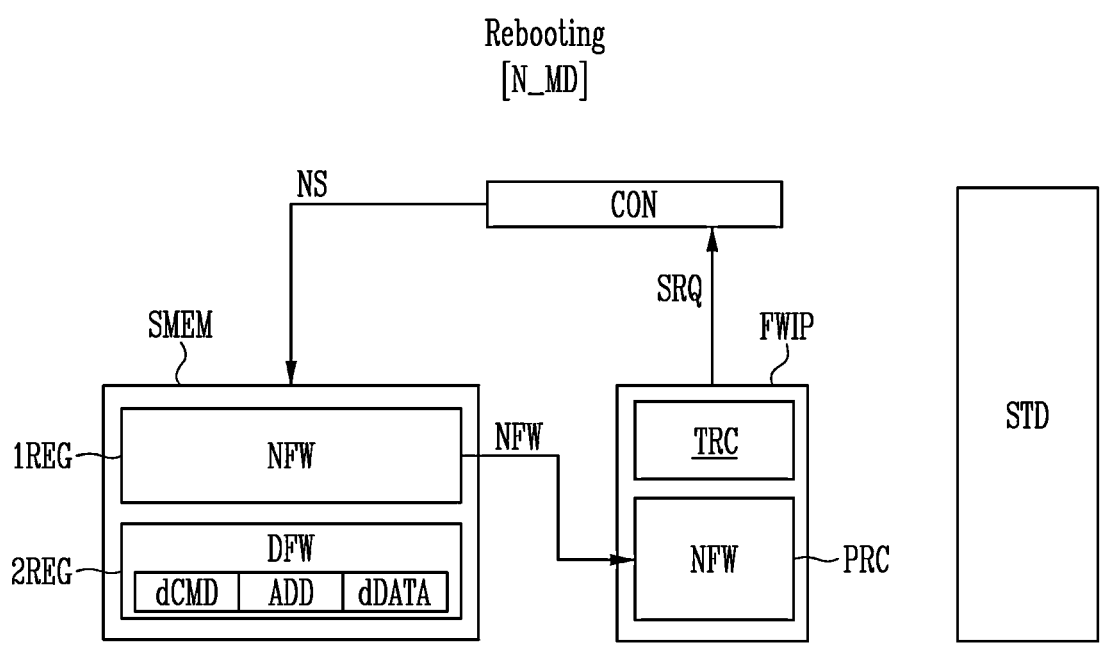

Referring to FIG. 7I, when the memory system MEMS is rebooted, the controller CON may output a normal signal NS to the system memory SMEM to drive the memory system MEMS in the normal mode N_MD.

When the normal signal NS is received, the system memory SMEM may upload the normal firmware NFW stored in the first storage 1REG to the processor PRC of the firmware implementer FWIP.

The processor PRC may output a setup request SRQ by using the trimming circuit TRC according to the normal firmware NFW uploaded thereto. The setup request SRQ may be a request for setting up the devices included in the memory system MEMS. The controller CON may set up devices included in the controller CON to be driven according to the setup request SRQ, and set up the values for inputting/outputting data to/from the storage device STD.

As described above, in this embodiment, when an error, which is detected using the normal firmware NFW is determined uncorrectable, the debugging firmware DFW for processing a memory block in which the error is detected is autonomously uploaded and implemented within the memory system MEMS, so that the debugging operation of the memory system MEMS can be simplified.

Figure 8:
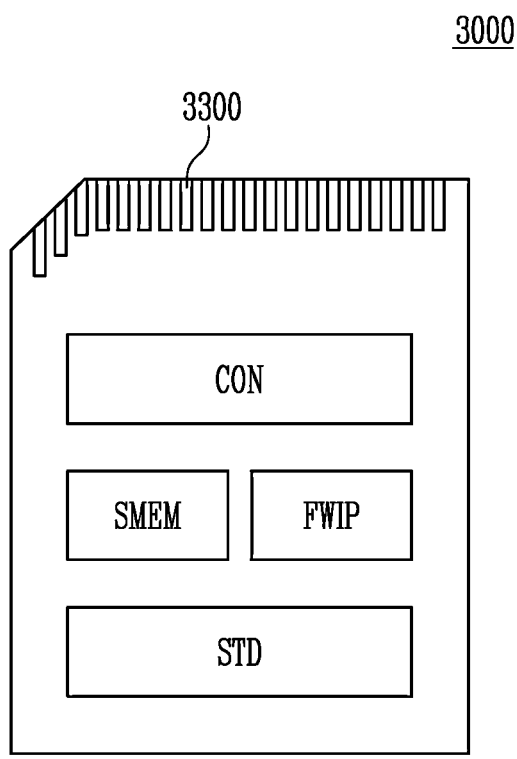
FIG. 8 illustrates a memory card system to which the memory system of the present disclosure is applied.

FIG. 8 illustrates a memory card system 3000 to which the memory system of the present disclosure is applied.

Referring to FIG. 8, the memory card system 3000 may include a controller CON, a system memory SMEM, a firmware implementer FWIP, and a storage device STD.

The controller CON may control overall operations of the memory card system 3000. For example, the controller CON may control the system memory SMEM, the firmware implementer FWIP, and the storage device STD. The controller CON may be configured to be identical to the controller CON shown in FIG. 4. The controller CON may provide an interface among the system memory SMEM, the firmware implementer FWIP, and the storage device STD.

The controller CON may communicate with an external device through a connector 3300. The controller CON may communicate with the external device (e.g., host) according to a specific communication protocol. Exemplarily, the controller CON may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The system memory SMEM may store normal firmware NFW and debugging firmware DFW. The system memory SMEM may be configured as a nonvolatile memory device. For example, the system memory SMEM may be configured as a Read Only Memory (ROM), a Programmable ROM (PROM), an Electrically Programmable ROM (EPROM), an Electrically Erasable and Programmable ROM (EEPROM), a flash memory, or the like.

The firmware implementer FWIP may upload thereto firmware selected from the normal firmware NFW and the debugging firmware DFW, which are stored in the system memory SMEM, and implement the uploaded firmware. For example, the firmware implementer FWIP may include a processor for storing and driving the normal firmware NFW or the debugging firmware DFW and a trimming circuit for inputting/outputting various signals under the control of the processor.

The storage device STD may be configured with one of various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin Transfer Torque-Magnetic RAM (STT-MRAM), and so on.

The controller CON, the system memory SMEM, the firmware implementer FWIP, and the storage device STD may be integrated into a single semiconductor device to constitute a memory card. For example, the controller CON, the system memory SMEM, the firmware implementer FWIP, and the storage device STD may constitute a memory card such as a PC card (e.g., Personal Computer Memory Card International Association (PCMCIA)), a Compact Flash (CF) card, a Smart Media Card (e.g., SM or SMC), a memory stick, a Multi-Media Card (e.g., MMC, RS-MMC, MMCmicro, or eMMC), an SD card (e.g., SD, miniSD, microSD, or SDHC), and a Universal Flash Storage (UFS).

Figure 9:
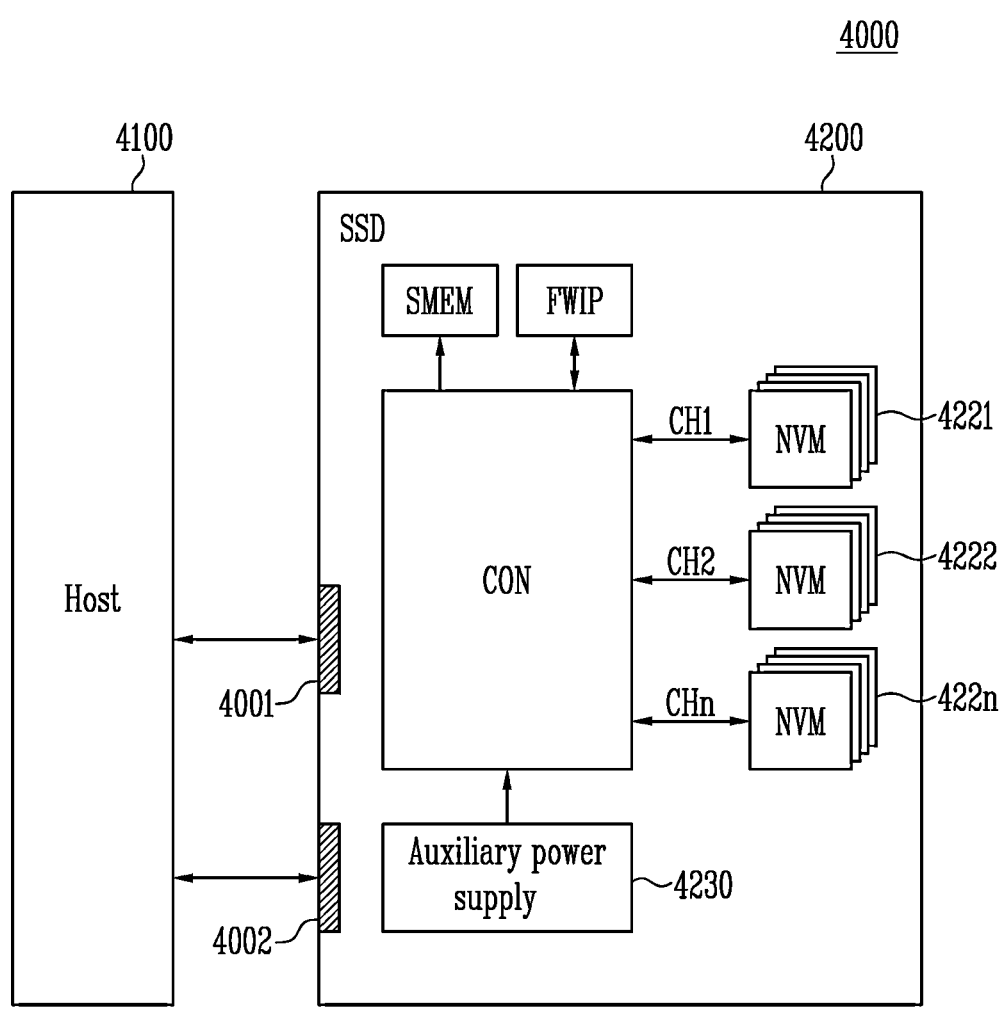
FIG. 9 illustrates a Solid State Drive (SSD) system to which the memory system of the present disclosure is applied.

FIG. 9 illustrates a Solid State Drive (SSD) system 4000 to which the memory system of the present disclosure is applied.

Referring to FIG. 9, the SSD system 4000 includes a host 4100 and an SSD 4200. The SSD 4200 exchanges a signal with the host 4100 through a signal connector 4001, and be supplied with power through a power connector 4002. The SSD 4200 may include a controller CON, a system memory SMEM, a firmware implementer FWIP, a plurality of flash memories 4221 to 422n, and an auxiliary power supply 4230.

In accordance with an embodiment of the present disclosure, the controller CON may function as the controller CON described with reference to FIG. 4.

The controller CON may control the plurality of flash memories 4221 to 422n in response to signals received from the host 4100. Exemplarily, the signals may be signals based on an interface between the host 4100 and the SSD 4200. For example, the signals may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The system memory SMEM may include first and second storages 1REG and 2REG and store normal firmware NFW and debugging firmware DFW in the first and the second storages 1REG and 2REG, respectively. The first and the second storages 1REG and 2REG of the system memory SMEM may be configured with a nonvolatile memory device. For example, the system memory SMEM may be configured as a Read Only Memory (ROM), a Programmable ROM (PROM), an Electrically Programmable ROM (EPROM), an Electrically Erasable and Programmable ROM (EEPROM), a flash memory, or the like.

The firmware implementer FWIP may upload thereto firmware selected from the normal firmware NFW and the debugging firmware DFW, which are stored in the system memory SMEM, and implement the uploaded firmware. For example, the firmware implementer FWIP may include a processor for storing and driving the normal firmware NFW or the debugging firmware DFW and a trimming circuit for inputting/outputting various signals under the control of the processor.

The auxiliary power supply 4230 may be connected to the host 4100 through the power connector 4002. The auxiliary power supply 4230 may be supplied with power from the host 4100 and charge the power. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200. For example, the auxiliary power supply 4230 may be located on a main board, and provide auxiliary power to the SSD 4200.

In accordance with the embodiment of the present disclosure, when an error occurs in a memory system, an erase operation may be performed on a memory block in which the error occurs by implementing debugging firmware included in the memory system without connecting to any external device to upload the debugging firmware to the memory system. Therefore, a debugging operation of the memory system can be simplified.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory system comprising:
a storage device configured to store data;
a system memory in which normal firmware and debugging firmware are stored;
a firmware implementer configured to implement the normal firmware or the debugging firmware; and
a controller configured to control the storage device in a normal mode in which the memory system is driven by the normal firmware,
wherein, when an error detected in the normal mode is uncorrectable, the controller uploads the debugging firmware stored in the system memory to the firmware implementer to change the normal mode to a debugging mode, and
wherein the firmware implementer performs a debugging operation on the storage device by implementing the uploaded debugging firmware.

2. The memory system of claim 1, wherein the system memory includes:
a first storage configured to store the normal firmware; and
a second storage configured to store the debugging firmware.

3. The memory system of claim 2, wherein each of the first and the second storages is configured with at least one of a Read Only Memory (ROM), a Programmable ROM (PROM), an Electrically Programmable ROM (EPROM), an Electrically Erasable and Programmable ROM (EEPROM), or a flash memory.

4. The memory system of claim 1, wherein the controller:
uploads the normal firmware stored in the system memory to the firmware implementer in the normal mode; and
uploads the debugging firmware stored in the system memory to the firmware implementer in the debugging mode.

5. The memory system of claim 1, wherein the firmware implementer includes:
a processor configured to implement the normal firmware or the debugging firmware, which is uploaded from the system memory; and
a trimming circuit configured to transfer a debugging command, an address, or debugging data according to the debugging firmware, which is uploaded to the processor.

6. The memory system of claim 1, wherein, when the normal firmware is uploaded to the firmware implementer, the firmware implementer transmits a setup request to the controller.

7. The memory system of claim 6, wherein the setup request is a request for setting up devices included in the memory system when the memory system is booted.

8. The memory system of claim 1, wherein, when the debugging firmware is uploaded to the firmware implementer, the firmware implementer transmits a debugging command, an address, and debugging data to the controller.

9. The memory system of claim 8, wherein the debugging command is a command for performing an operation selected from among a debugging program operation, a debugging read operation, and a debugging erase operation,
the address is a physical address of a memory block included in the storage device, and
the debugging data is data to be temporarily stored in the memory block included in the storage device in the debugging program operation.

10. The memory system of claim 9, wherein, in the debugging program operation, the debugging firmware programs the debugging data in the memory block included in the storage device.

11. The memory system of claim 10, wherein the debugging data has a pattern in which data 0 and data 1 are randomly mixed.

12. The memory system of claim 10, wherein the debugging data has a pattern configured with only one of data 0 and data 1.

13. The memory system of claim 9, wherein, in the debugging program operation, when a time taken to program the debugging data in the memory block is longer than a debugging reference time or a pulse number of a program voltage used to program the debugging data in the memory block is greater than a debugging reference pulse number, the debugging firmware processes the memory block as a bad block.

14. The memory system of claim 9, wherein, in the debugging read operation, the debugging firmware reads debugging data stored in the memory block.

15. The memory system of claim 14, wherein the debugging firmware:
   performs the debugging erase operation on a memory block in which an error is detected, when the error is detected in data read from the memory block and when a number of bits of the error is smaller than a debugging reference number having a preset value; and
   processes, as a bad block, the memory block in which the error is detected, when the number of bits of the error is equal to or greater than the debugging reference number.

16. The memory system of claim 9, wherein, when the debugging erase operation is performed, the debugging firmware erases data stored in a memory block in which an error is detected among memory blocks included in the storage device.

17. The memory system of claim 16, wherein, when a time taken to perform the debugging erase operation is longer than a debugging reference time or when a pulse number of an erase voltage used for the debugging erase operation is greater than a debugging reference pulse number, the debugging firmware processes the memory block in which the error is detected as a bad block.

18. The memory system of claim 1, wherein, in the normal mode,
   the controller outputs a normal signal to the system memory,
   the system memory uploads the normal firmware to the firmware implementer in response to the normal signal, and
   the firmware implementer implements the normal firmware.

19. The memory system of claim 1, wherein, when the normal mode is changed to the debugging mode,
   the controller outputs a reset signal to the firmware implementer and outputs a debugging signal to the system memory,
   the firmware implementer deletes the uploaded normal firmware in response to the reset signal,
   the system memory uploads the debugging firmware to the firmware implementer in response to the debugging signal, and
   the firmware implementer from which the normal firmware is deleted implements the uploaded debugging firmware.

20. The memory system of claim 1, wherein, when the debugging mode is ended,
   the controller outputs a reset signal to the firmware implementer and outputs a normal signal to the system memory,
   the firmware implementer deletes the debugging firmware uploaded thereto in response to the reset signal,
   the system memory uploads the normal firmware to the firmware implementer in response to the normal signal, and
   the firmware implementer implements the normal firmware.

21. The memory system of claim 20, wherein, after the debugging mode is changed to the normal mode, the controller is rebooted.

22. The memory system of claim 1, wherein the controller includes:
   a host interface configured to communicate with a host;
   a memory interface configured to communicate with the storage device;
   a buffer memory configured to store a mapping table in which a logical address and a physical address are mapped to each other;
   a system memory interface configured to communicate with the system memory;
   a firmware implementer interface configured to communicate with the firmware implementer;
   an error correction circuit configured to detect and correct an error in data read from the storage device; and
   a central processing unit configured to control the host interface, the memory interface, the buffer memory, the system memory interface, the firmware implementer interface, and the error correction circuit.

23. A method of operating a memory system including a controller, a system memory, a firmware implementer, and a storage device, the method comprising:
   storing normal firmware and debugging firmware in the system memory;
   uploading the normal firmware stored in the system memory to the firmware implementer;
   setting up the controller in a normal mode according to the normal firmware uploaded to the firmware implementer;
   uploading the debugging firmware stored in the system memory to the firmware implementer to change the normal mode to a debugging mode, when an error occurs in the storage device driven in the normal mode;
   performing a debugging operation on the storage device according to the debugging firmware uploaded to the firmware implementer; and
   changing the debugging mode to the normal mode by uploading the normal firmware stored in the system memory to the firmware implementer, after the debugging operation is completed.

24. The method of claim 23, further comprising deleting the normal firmware uploaded to the firmware implementer, before uploading the debugging firmware to the firmware implementer.

25. The method of claim 23, further comprising, before uploading the normal firmware to the firmware implementer after the debugging operation is completed,
   deleting the debugging firmware uploaded to the firmware implementer; and
   rebooting the memory system.

26. The method of claim 23, wherein, when devices included in the memory system are set up, values for an input/output between devices included in the memory system are set up.

27. The method of claim 23, wherein the debugging operation includes a debugging program operation, a debugging read operation, and a debugging erase operation.

28. The method of claim 27, wherein the debugging program operation is performed to program debugging data in a memory block included in the storage device.

29. The method of claim 28, wherein the debugging data has a pattern in which data 0 and data 1 are randomly mixed.

30. The method of claim 28, wherein the debugging data has a pattern configured with only one of data 0 and data 1.

31. The method of claim 27, wherein, in the debugging program operation, when a time taken to program the debugging data in a memory block included in the storage device is longer than a debugging reference time or a pulse number of a program voltage used to program the debugging data in the memory block is greater than a debugging reference pulse number, the debugging firmware processes the memory block as a bad block.

32. The method of claim 27, wherein the debugging read operation is performed to read debugging data stored in a memory block included in the storage device.

33. The method of claim 32, wherein, when an error is detected in data read from the memory block included in the storage device, the method comprises:
   performing a debugging erase operation on the memory block included in the storage device in which the error is detected, when a number of bits of the error is smaller than a debugging reference number having a preset value, and
   processing the memory block in which the error detected as a bad block, when the number of bits of the error is equal to or greater than the debugging reference number.

34. The method of claim 27, wherein the debugging erase operation is performed to erase data stored in a memory block included in the storage device in which an error is detected.

35. The method of claim 34, wherein, when a time taken to perform the debugging erase operation is longer than a debugging reference time or when a pulse number of an erase voltage used for the debugging erase operation is greater than a debugging reference pulse number, the debugging firmware processes the memory block as a bad block.

* * * * *